(12) United States Patent
Colombeau et al.

(10) Patent No.: US 12,471,322 B2
(45) Date of Patent: *Nov. 11, 2025

(54) HORIZONTAL GAA NANO-WIRE AND NANO-SLAB TRANSISTORS

(71) Applicant: Applied Materials, Inc., Santa Clara, CA (US)

(72) Inventors: Benjamin Colombeau, San Jose, CA (US); Hans-Joachim Gossmann, Summit, NJ (US)

(73) Assignee: Applied Materials, Inc., Santa Clara, CA (US)

( * ) Notice: Subject to any disclaimer, the term of this patent is extended or adjusted under 35 U.S.C. 154(b) by 637 days.

This patent is subject to a terminal disclaimer.

(21) Appl. No.: 17/956,061

(22) Filed: Sep. 29, 2022

(65) Prior Publication Data

US 2023/0014586 A1   Jan. 19, 2023

Related U.S. Application Data

(63) Continuation of application No. 17/073,505, filed on Oct. 19, 2020, now Pat. No. 11,495,500.

(Continued)

(51) Int. Cl.
*H10D 30/67* (2025.01)
*H01L 21/02* (2006.01)
(Continued)

(52) U.S. Cl.
CPC ..... *H10D 30/6757* (2025.01); *H01L 21/0245* (2013.01); *H01L 21/02532* (2013.01); *H01L 21/324* (2013.01); *H10D 30/6735* (2025.01); *H10D 62/119* (2025.01); *H10D 84/0128* (2025.01); *H10D 84/038* (2025.01)

(58) Field of Classification Search
CPC .......... H01L 21/0245; H01L 21/02532; H01L 21/324; H10D 30/01; H10D 30/014; H10D 30/017; H10D 30/019–0198; H10D 30/0273; H10D 30/0323; H10D 30/43; H10D 30/435; H10D 30/501–509; H10D 30/6713; H10D 30/6735; H10D 30/674; H10D 30/6757; H10D 62/116; H10D 62/119; H10D 62/121; H10D 62/299;
(Continued)

(56) References Cited

U.S. PATENT DOCUMENTS 9,460,920 B1   10/2016   Sun et al.
9,484,406 B1   11/2016   Sun et al.
(Continued)

FOREIGN PATENT DOCUMENTS

JP   2011029631 A   2/2011
JP   2017508289 A   3/2017
(Continued)

OTHER PUBLICATIONS

"PCT International Search Report and Written Opinion in PCT/US2020/056282 dated Mar. 123, 2021, 10 pages".

*Primary Examiner* — Cheung Lee
(74) *Attorney, Agent, or Firm* — Servilla Whitney LLC (57) ABSTRACT

Horizontal gate-all-around devices and methods of manufacturing same are described. The hGAA devices comprise a doped semiconductor material between source regions and drain regions of the device. The method includes doping semiconductor material layers between source regions and drain regions of an electronic device.

20 Claims, 4 Drawing Sheets

Related U.S. Application Data (60) Provisional application No. 63/014,389, filed on Apr. 23, 2020, provisional application No. 62/924,120, filed on Oct. 21, 2019.

(51) Int. Cl.
   *H01L 21/324*    (2006.01)
   *H10D 62/10*     (2025.01)
   *H10D 84/01*     (2025.01)
   *H10D 84/03*     (2025.01)

(58) Field of Classification Search
   CPC .... H10D 62/314; H10D 64/01; H10D 64/017; H10D 84/01; H10D 84/0128; H10D 84/038
   See application file for complete search history.

(56) References Cited

U.S. PATENT DOCUMENTS

| | | |
|---|---|---|
| 9,673,277 B2 | 6/2017 | Brand et al. |
| 10,269,571 B2 | 4/2019 | Wong et al. |
| 2011/0001179 A1 | 1/2011 | Yanagi et al. |
| 2014/0227849 A1 | 8/2014 | Licausi et al. |
| 2014/0264276 A1 | 9/2014 | Chang et al. |
| 2015/0001593 A1 | 1/2015 | Kuo et al. |
| 2015/0206752 A1 | 7/2015 | Li et al. |
| 2015/0279855 A1 | 10/2015 | Lu et al. |
| 2016/0111495 A1 | 4/2016 | Brand et al. |
| 2016/0336405 A1 | 11/2016 | Sun et al. |
| 2017/0194430 A1 | 7/2017 | Wood et al. |
| 2017/0213911 A1 | 7/2017 | Balakrishnan et al. |
| 2017/0309719 A1 | 10/2017 | Sun et al. |
| 2018/0102359 A1 | 4/2018 | Cheng et al. |
| 2018/0151683 A1 | 5/2018 | Yeo et al. |
| 2018/0301531 A1 | 10/2018 | Xie |
| 2019/0035923 A1 | 1/2019 | Sadana et al. |
| 2019/0214311 A1 | 7/2019 | Seshadri et al. |
| 2019/0312120 A1 | 10/2019 | Zhang et al. |
| 2020/0075594 A1 | 3/2020 | Xiao et al. |

FOREIGN PATENT DOCUMENTS

| | | |
|---|---|---|
| JP | 2019500756 A | 1/2019 |
| KR | 20070095929 A | 10/2007 |
| KR | 20090023035 A | 3/2009 |
| KR | 101172853 B1 | 8/2012 |
| KR | 20140097521 A | 8/2014 |

HORIZONTAL GAA NANO-WIRE AND NANO-SLAB TRANSISTORS

CROSS-REFERENCE TO RELATED APPLICATIONS

This application is a continuation of U.S. application Ser. No. 17/073,505, filed Oct. 19, 2020, which claims priority to U.S. Provisional Application No. 62/924,120, filed Oct. 21, 2019, and claims priority to U.S. Provisional Application No. 63/014,389, filed Apr. 23, 2020, the entire disclosures of which are hereby incorporated by reference herein.

TECHNICAL FIELD

Embodiments of the present disclosure generally relate to semiconductor devices and more particularly to horizontal gate all around device structures and methods and apparatus for forming horizontal gate all around device structures.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The inventors believe that the hGAA structure provides good electrostatic control and can find broad adoption in complementary metal oxide semiconductor (CMOS) wafer manufacturing.

Logic gate performance is related to the characteristics of the materials used as well as the thickness and area of the structural layers. However, as some gate characteristics are adjusted to accommodate device scaling, challenges arise. Furthermore, the space confinement between wires on a horizontal gate-all-around (hGAA) device limits the thickness of the gate dielectric material for I/O transistors.

State-of-the-art System-on-a-Chip circuits require up to seven distinct threshold voltages for each type of circuit. This is currently accomplished by either (i) doping the channel by implanting a variety of doses into the channel, followed by anneal; or (ii) work-function modification by deposition, etching, and anneal of a multitude of ultra-thin metal layers covering the channel. The former creates defects in the channel, while the latter is very expensive, prone to yield-loss and limited by space-constraints.

Accordingly, there is a need for improved methods for forming horizontal gate-all-around devices.

SUMMARY

One or more embodiments of the disclosure are directed to methods of forming a semiconductor device. A superlattice structure comprising a plurality of first layers and a corresponding plurality of second layers alternatingly arranged in a plurality of stacked pairs is selectively etched to remove each of the first layers or each of the second layers to form a plurality of voids in the superlattice structure and a plurality of semiconductor material layers extending between a source region and a drain region. The plurality of semiconductor material layers are doped to form doped semiconductor material layers.

Additional embodiments of the disclosure are directed to horizontal gate-all-around device comprising a plurality of horizontal doped semiconductor material layers between a source region and a drain region.

Further embodiments of the disclosure are directed to computer readable medium, having instructions stored thereon which, when executed, cause a method of forming a semiconductor device. The method comprises selectively etching a superlattice structure comprising a plurality of first layers and a corresponding plurality of second layers alternatingly arranged in a plurality of stacked pairs to remove each of the first layers or each of the second layers to form a plurality of voids in the superlattice structure and a plurality of semiconductor material layers extending between a source region and a drain region; and doping the plurality of semiconductor material layers to form doped semiconductor material layers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated ID. Drain-to-source voltage is designated VDS. By applying voltage to gate (G), the current entering the channel at the drain (i.e. ID) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g. a transistor, in which the gate material surrounds the channel region on all sides. The channel region of a GAA transistor may include nano-wires or nano-slabs, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

In one or more embodiments, a horizontal gate-all-around (hGAA) transistor comprises a substrate having a top surface; a source region having a source and a source contact, the source region on the top surface of the substrate; a drain region having a drain and a drain contact, the drain region on the top surface of the substrate; a channel located between the source and the drain and having an axis that is substantially parallel to the top surface of the substrate; a gate enclosing the channel between the source region and the drain region; a thermal oxide layer overlying and in contact with one or more of the gate, the source contact, or the drain contact, and a low-K dielectric layer overlying the thermal oxide layer. In one or more embodiments, the low-K dielectric layer has a thickness less than about 5 nm.

One or more embodiments of the disclosure are directed to methods of forming horizontal gate-all-around devices. Some embodiments advantageously provide methods to diffuse dopants into the active region to dope the channel and shift the threshold voltage (also referred to as the gate voltage). In some embodiments, the channel surface is exposed to an appropriate dopant-bearing gas (e.g., $B_2H_6$), followed by an appropriate anneal (e.g., 800° C. laser anneal). Some embodiments advantageously provide defect-free and simple methods for forming hGAA devices. Some embodiments are advantageously not constrained by open space between nano-wires or nano-slabs.

In some embodiments, a method for forming the hGAA devices is augmented to insert one or more processes between wire-release (etching of the SiGe release layers so that the nano-wires become free) and replacement metal gate (deposition of gate dielectrics, work-function metal and associated material films). In some embodiments, the method exposes the wires to a dopant-bearing gas and annealing the wafer (e.g., by laser or spike anneal). Some embodiments advantageously provide atomically clean (e.g., oxide free) surfaces. In some embodiments, the channel doping and resulting Vt are adjusted by one or more of temperature or gas exposure.

While embodiments of the disclosure are described with respect to boron doping and nFETs, the skilled artisan will recognize that the disclosure is not limited to this type of transistor. In some embodiments, one or more methods for channel doping and threshold voltage of pFETs are disclosed using suitable p-type doping gases.

Figure 1:
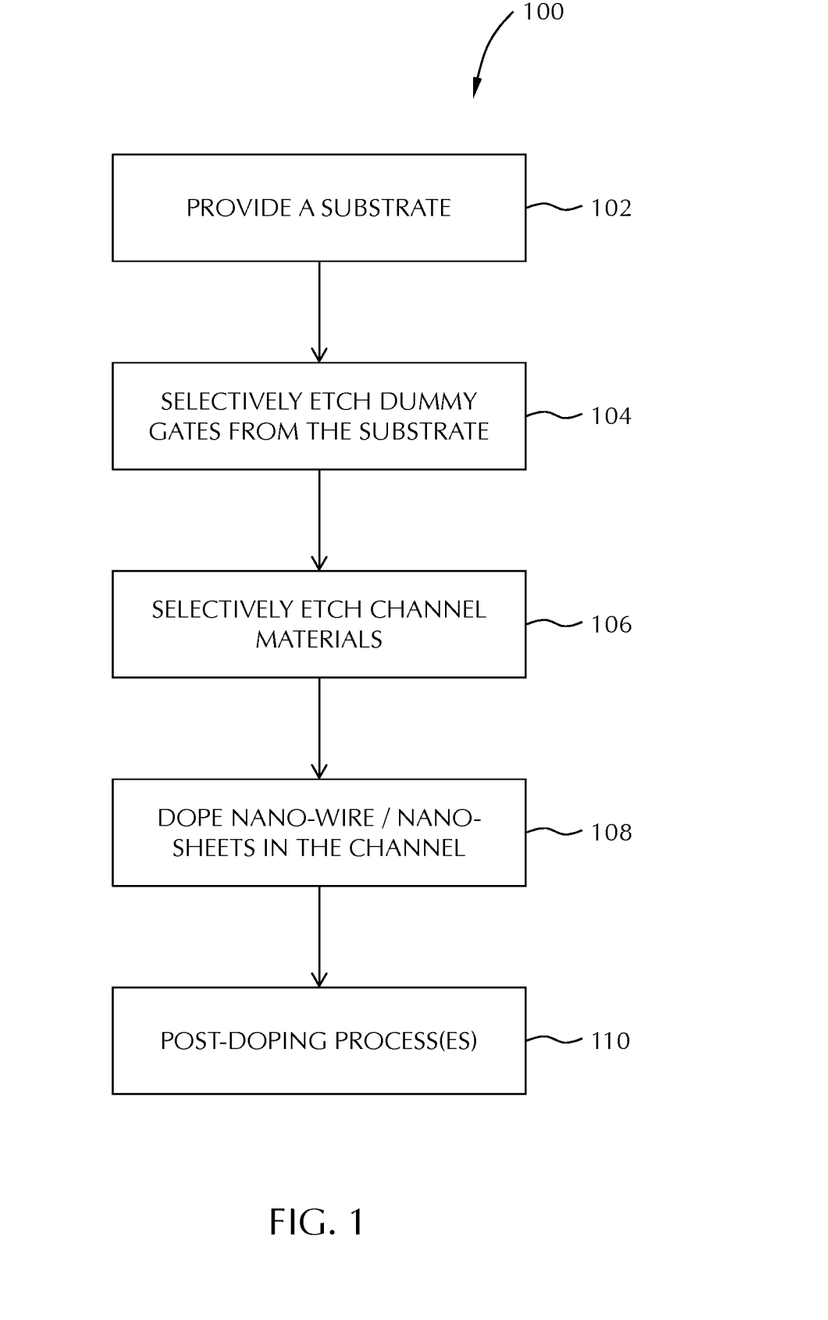
FIG. 1 depicts a flow chart of a method for forming a semiconductor device in accordance with some embodiments of the present disclosure.

FIG. 1 depicts a flow chart for a method 100 for forming a semiconductor device in accordance with some embodiments of the present disclosure. The method 100 is described below with respect to FIGS. 2A-2H, which depicts the stages of fabrications of semiconductor structures in accordance with some embodiments of the present disclosure. The inventive method 100 may be part of a multi-step fabrication process of, a semiconductor device. Accordingly, the method may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Figure 2A:
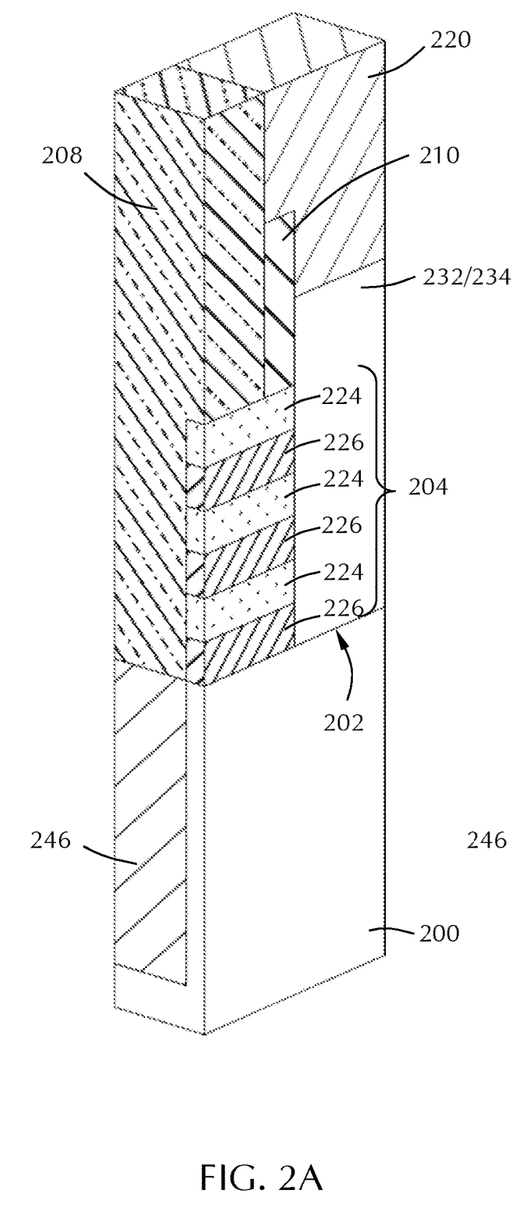
FIGS. 2A-2F illustrate stages of fabrication of a substrate during a method of forming a semiconductor device in accordance with some embodiments of the present disclosure.

The method 100 begins at 102, by providing a substrate 200 having a top surface 202 (as illustrated in FIG. 2A). In some embodiments, the substrate 200 may be a bulk semiconductor substrate. The term bulk semiconductor substrate refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In some embodiments, the semiconductor material may be a doped material, such as n-doped silicon (n-Si), or p-doped silicon (p-Si). In some embodiments, the substrate may be doped using any suitable process such as an ion implantation process. In some embodiments, the substrate may be doped to provide a high dose of dopant at a first location of the surface of the substrate 200 in order to prevent parasitic bottom device turn on. The superlattice structure is formed atop the first location. For example, in some embodiments, the surface of the substrate may have a dopant density about $10^{18}$ atoms/cm$^3$ to about $10^{19}$ atoms/cm$^3$.

At least one superlattice structure 204 is formed atop the top surface 202 of the substrate 200 (as depicted in FIG. 2A). The superlattice structure 204 comprises a plurality of first layers and a corresponding plurality of second layers alternatingly arranged in a plurality of stacked pairs. In some embodiments the plurality of stacked groups of layers comprises a silicon (Si) and a silicon germanium (SiGe) group and an indium-phosphorus (InP) and an indium-gallium-phosphorus (InGaP) group. In some embodiments, the plurality of first layers and corresponding plurality of second layers can comprise any number of lattice matched material pairs suitable for forming a superlattice structure 204. In some embodiments, the plurality of first layers and corresponding plurality of second layers comprise 2 to 50 pairs of lattice matched materials.

Typically, a parasitic device will exist at the bottom of the superlattice structure 204. In some embodiments, implant of a dopant in the substrate, as discussed above, is used to suppress the turn on of the parasitic device. In some embodiments, the substrate 200 is etched so that the bottom portion of the superlattice structure 204 includes a substrate portion which is not removed, allowing the substrate portion to act as the bottom release layer of the superlattice structure 204.

The thicknesses of the first layers and second layers in some embodiments are in the range of about 2 nm to about 50 nm, or in the range of about 3 nm to about 20 nm. In some embodiments, the average thickness of the first layers is within 0.5 to 2 times the average thickness of the second layers.

In some embodiments, the dielectric material 246 is deposited on the substrate 200 using conventional chemical vapor deposition methods. In some embodiments, the dielectric material 246 is recessed below the top surface 202 of the substrate 200 so that the bottom portion of the superlattice structure 204 is formed from the substrate 200.

In some embodiments, a replacement gate structure (e.g., a dummy gate structure 208) is formed over the superlattice structure 204. The dummy gate structure 208 defines the channel region of the transistor device. The dummy gate structure 208 may be formed using any suitable conventional deposition and patterning process known in the art.

In some embodiments, sidewall spacers 210 are formed along outer sidewalls of the dummy gate structure 208. The sidewall spacers 210 of some embodiments comprise suitable insulating materials known in the art, for example, silicon nitride, silicon oxide, silicon oxynitride, silicon carbide, or the like. In some embodiments, the sidewall spacers 210 are formed using any suitable conventional deposition and patterning process known in the art, such as atomic layer deposition, plasma enhanced atomic layer deposition, plasma enhanced chemical vapor deposition or low pressure chemical vapor deposition.

In some embodiments, the embedded source region 232 and drain region 234 form in a source trench and a drain trench, respectively. In some embodiments, the source region 232 is formed adjacent a first end of the superlattice structure 204 and the drain region 234 is formed adjacent a second, opposing end of the superlattice structure. In the embodiment illustrated in FIG. 2A, the view one of the source region 232 or drain region 234 is not shown at the front face of the superlattice structure 204. The other end of the superlattice structure 204 has the other of the source region 232 or drain region 234. In some embodiments, the source region 232 and/or drain region 234 are formed from any suitable semiconductor material, such as but not limited to silicon, germanium, silicon germanium, or the like. In some embodiments, the source region 232 and drain region 234 may be formed using any suitable deposition process, such as an epitaxial deposition process.

In some embodiments, an inter-layer dielectric (ILD) layer 220 is blanket deposited over the substrate 200, including the source/drain regions 232, 234, the dummy gate structure 208, and the sidewall spacers 210. The ILD layer 220 may be deposited using a conventional chemical vapor deposition method (e.g., plasma enhance chemical vapor deposition and low pressure chemical vapor deposition). In an embodiment, ILD layer 220 is formed from any well-known dielectric material such as, but not limited to undoped silicon oxide, doped silicon oxide (e.g., BPSG, PSG), silicon nitride, and silicon oxynitride. ILD layer 220 is then polished back using a conventional chemical mechanical planarization method to expose the top of the dummy gate structure 208. In some embodiments, the ILD layer 220 is polished to expose the top of the dummy gate structure 208 and the top of the sidewall spacers 210.

Figure 2B:
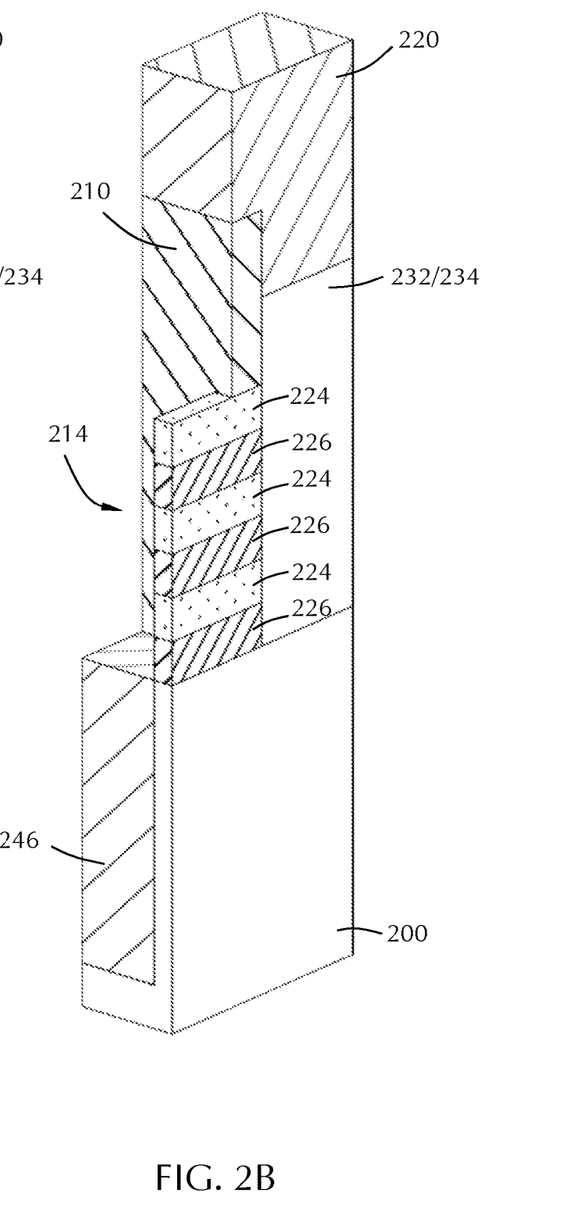

In process 104, as shown in FIG. 2B, the dummy gate structure 208 is removed to expose the channel region 214 of the superlattice structure 204. The ILD layer 220 protects the source/drain regions 232, 234 during the removal of the dummy gate structure 208. The dummy gate structure 208 may be removed using a conventional etching method such plasma dry etch or a wet etch. In some embodiments, the dummy gate structure 208 comprises poly-silicon and the dummy gate structure is removed by a selective etch process. In some embodiments, the dummy gate structure 208 comprises poly-silicon and the superlattice structure 204 comprises alternating layers of silicon (Si) and silicon germanium (SiGe).

Figures 2C, 2D:
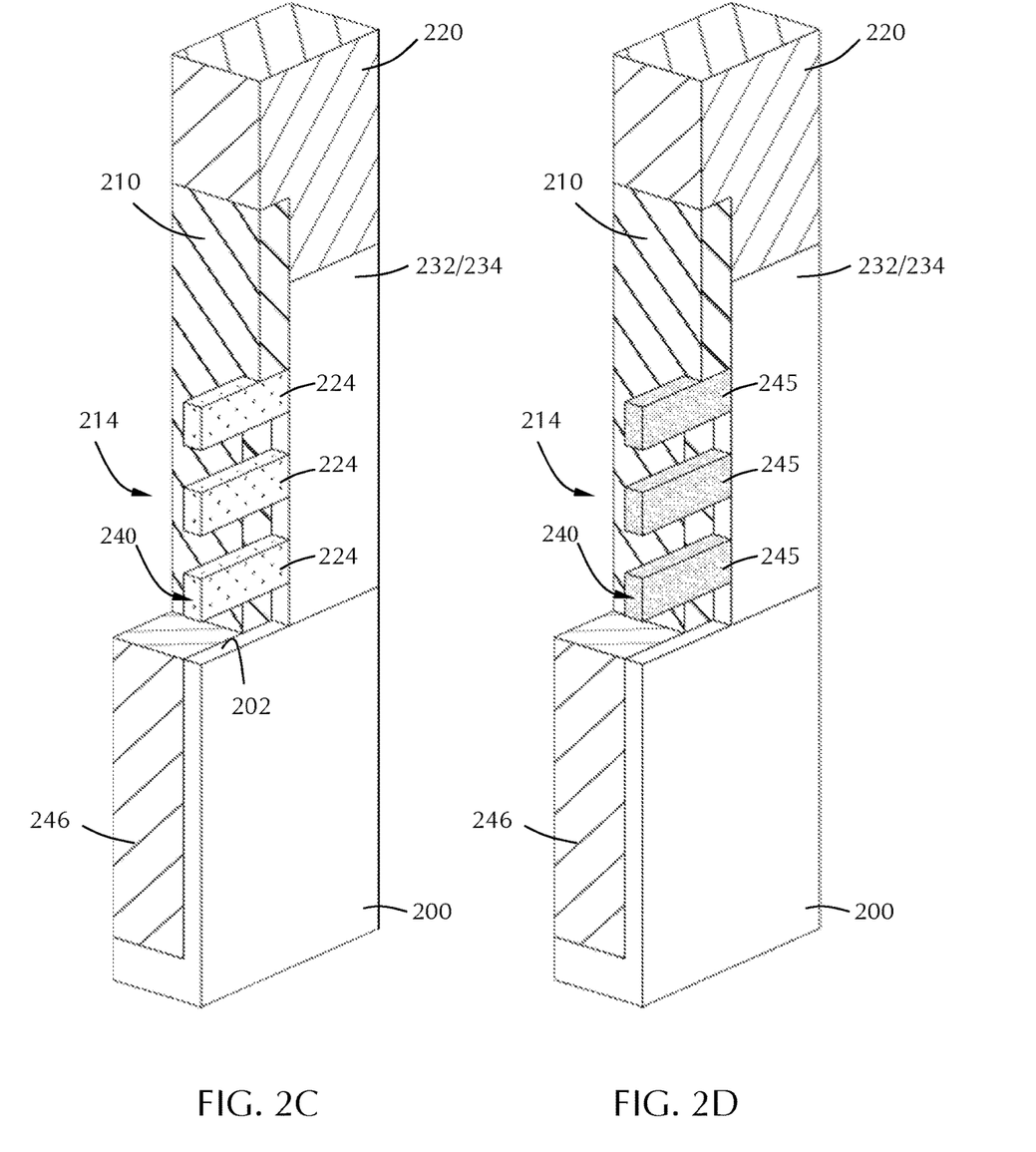

In process 106, as shown in FIG. 2C, the release layers 226 are selectively etched between the semiconductor material layers 224 in the superlattice structure 204. For example, where the superlattice structure 204 is composed of silicon layers and silicon germanium layers, the silicon germanium is selectively etched to form channel nanowires 240. The release layers 226, for example silicon germanium, may be removed using any well-known etchant that is selective to the layers of the semiconductor material layers 224 where the etchant etches the layers of release layers 226 at a significantly higher rate than the layers of semiconductor material layers 224. In some embodiments, a selective dry etch or wet etch process may be used. In some embodiments, where the semiconductor material layers 224 are silicon and the release layers 226 are silicon germanium, the layers of silicon germanium may be selectively removed using a wet etchant such as, but not limited to aqueous carboxylic acid/nitric acid/HF solution and aqueous citric acid/nitric acid/HF solution. The removal of the release layers 226 leaves voids 228 between the semiconductor material layers 224. The voids 228 between the semiconductor material layers 224 have a thickness of about 3 nm to about 20 nm. The remaining semiconductor material layers 224 form a vertical array of channel nanowires 240 that are coupled to the source/drain regions 232, 234. The channel nanowires 240 run parallel to the top surface 202 of the substrate 200 and are aligned with each other to form a single column of channel nanowires 240. The formation of the source region 232 and drain region 234 and the formation of an optional lateral etch stop layer (not shown) advantageously provide self-alignment and structural integrity in the formation of the channel structure.

In process 108, as shown in FIG. 2D, the semiconductor material layers 224 exposed in the channel region 214, is exposed to one or more doping processes to form a doped semiconductor material layer 245. In some embodiments, doping the exposed semiconductor material layer 224 is done by exposing the semiconductor material layers 224 to a dopant gas. The dopant gas can be any suitable gas known to the skilled artisan that can react with the semiconductor material layer 224. In some embodiments, the dopant is an n-type dopant. In some embodiments, the dopant is a p-type dopant. In some embodiments, the dopant is selected from one or more of boron (B), aluminum (Al), indium (In), phosphorous (P), gallium (Ga), arsenic (As) nitrogen (N) or antimony (Sb). In some embodiments, the dopant gas comprises $B_2H_6$. In some embodiments, the dopant gas consists essentially of $B_2H_6$. As used in this manner, the term "consists essentially of" means that the total of the active dopant species are greater than or equal to about 95%, 98%, 99% or 99.5% of the total doping species. For example, diluent and/or carrier gases which remain inert to the semiconductor material layer 224 or other gaseous species are not included.

In some embodiments, the one or more doping processes includes an anneal process. In one or more embodiments, exposing the semiconductor material layers 224 to a dopant gas causes a gradient concentration of dopant to form so that the dopant concentration at the outer edges of the doped semiconductor material layers 245 is greater than the concentration in the inner part of the doped semiconductor material layers 245. In some embodiments, the dopant concentration remains non-uniform after annealing. Without being bound by any particular theory of operation, it is believed that the degree of dopant homogeneity affects the gate voltage to turn on the device, or the current carrying ability of the semiconductor portion. In some embodiments, the dopant concentration gradient is controlled to so that the concentration drops by an order of magnitude over outermost 0.5 nm, 0.75 nm, 1 nm, 1.25 nm, 1.5 nm, 1.75 nm or 2 nm.

In some embodiments, annealing causes the dopant concentration within the doped semiconductor material layers 245 to homogenize or become more uniformly distributed throughout the thickness of the doped semiconductor material layers 245. In some embodiments, the doped semiconductor material layers 245 have a dopant concentration at any given distance from the surface of the layer that is within 50%, 60%, 70%, 80%, 90% or 95% of the average dopant concentration.

In some embodiments, the total dopant concentration of any of the doped semiconductor material layers 245 is in the range of about $10^{17}$-$10^{21}$ atoms/cm$^3$. In some embodiments, the total dopant concentration of any of the doped semiconductor material layers 245 is in the range of about $10^{18}$-$10^{19}$ atoms/cm$^3$. In some embodiments, the dopant comprises boron with a total dopant concentration of about $10^{19}$ atoms/cm$^3$.

Annealing the doped semiconductor material layers 245 is done by any suitable annealing process and conditions known to the skilled artisan. In some embodiments, annealing comprises one or more of a spike anneal or laser anneal.

Figures 2E, 2F:
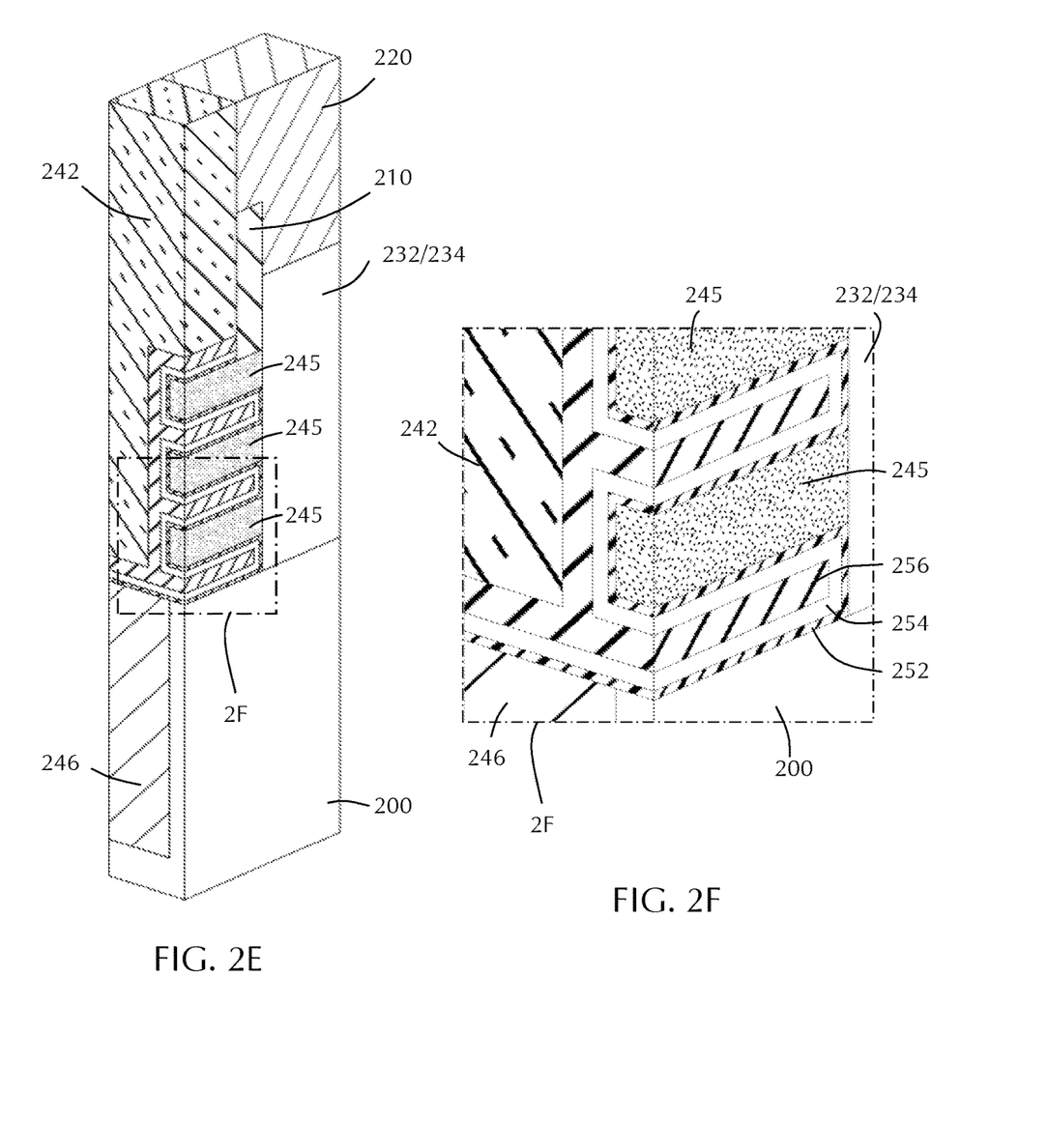

Process 110 of method 100 represents one or more post-doping processing according to some embodiments. The one or more post-doping processes can by any of the processes known to the skilled artisan for completion of the hGAA device. Referring to FIGS. 2E and 2F, in some embodiments, an oxide layer 252 is formed or grown on the doped semiconductor material layers 245. The oxide layer 252 can be any suitable oxide formed by any suitable technique known to the skilled artisan.

In the illustrated embodiment, a high-k dielectric 254 is formed on the oxide layer 252. The high-k dielectric 254 can be any suitable high-k dielectric material deposited by any suitable deposition technique known to the skilled artisan. The high-k dielectric 254 of some embodiments comprises hafnium oxide. In some embodiments, a conductive material 256 such as titanium nitride, tungsten, cobalt, aluminum, or the like is on the high-k dielectric 254. The conductive material 256 is formed using any suitable deposition process such as atomic layer deposition (ALD) in order to ensure the formation of a layer having a uniform thickness around each of the doped semiconductor material layer 245.

In some embodiments, a gate electrode 242 is formed on the substrate 200 and surrounds each of the doped semiconductor material layers 245. The gate electrode 242 may be formed from any suitable gate electrode material known in the art. The gate electrode material is deposited using any suitable deposition process such as atomic layer deposition (ALD) to ensure that gate electrode 242 is formed around and between each of the doped semiconductor material layers 245. The resultant device formed using the method described herein is a horizontal gate all around device, in accordance with an embodiment of the present disclosure. Some embodiments of the disclosure are directed to horizontal gate-all-around devices comprising a doped semiconductor material layer 245 as a nano-wire or nano-sheet in the channel between source and drain regions.

Some embodiments are directed to semiconductor devices comprises a horizontal gate-all-around device with a gate voltage greater than or equal to about 0.400 V. In some embodiments, the gate voltage of the device is greater than or equal to about 0.425 V, or 0.450 V. In some embodiments, the gate voltage required to turn on the device is greater than or equal to about 140% of the gate voltage required to turn on a similar device without the dopant. In some embodiments, the gate voltage required to turn on the device is in the range of 1 to 2 times the gate voltage to turn on a similar device without the dopant. As used in this manner, a "similar device" is prepared in the same manner as the subject device without the doping process.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A horizontal gate-all-around device comprising a plurality of horizontal doped semiconductor material layers between a source region and a drain region on a substrate, the plurality of horizontal doped semiconductor material layers having a homogeneous concentration of dopant.

2. The device of claim 1, wherein the homogeneous concentration of dopant is in a range of from about $10^{17}$ atoms/cm$^3$ to about $10^{21}$ atoms/cm$^3$ throughout the thickness of the plurality of horizontal doped semiconductor material layers.

3. The device of claim 1, wherein the dopant comprises about $10^{19}$ atoms/cm$^3$ of boron.

4. The device of claim 1, wherein the device has a gate voltage greater than or equal to about 0.400 V.

5. The device of claim 4, wherein the gate voltage required to turn on the device is greater than or equal to about 140% of the gate voltage required to turn on a device without the dopant.

6. The device of claim 4, wherein the gate voltage required to turn on the device is in the range of 1 to 2 times the gate voltage to turn on a device without the dopant.

7. The device of claim 1, further comprising a superlattice structure on a top surface of a substrate.

8. The device of claim 7, wherein the source region is adjacent a first end of the superlattice structure and the drain region is adjacent a second opposing end of the superlattice structure.

9. The device of claim 7, wherein the superlattice structure comprises the plurality of horizontal doped semiconductor material layers, an oxide layer on the plurality of horizontal doped semiconductor material layers, a high-k dielectric layer on the oxide layer, and conductive layer on the high-k dielectric layer.

10. The device of claim 9, wherein the conductive layer comprises one of more of titanium nitride, tungsten, cobalt, and aluminum.

11. The device of claim 9, wherein the conductive layer has a uniform thickness around each of the plurality of horizontal doped semiconductor material layers.

12. The device of claim 7, further comprising a gate electrode on the substrate and surrounding each of the plurality of horizontal doped semiconductor material layers.

13. A horizontal gate-all-around device comprising:
  a superlattice structure between a source region and a drain region on a substrate, the superlattice structure comprising a plurality of horizontal doped semiconductor material layers, an oxide layer on the plurality of horizontal doped semiconductor material layers, a high-k dielectric layer on the oxide layer, and conductive layer on the high-k dielectric layer, the plurality of horizontal doped semiconductor material layers having a homogeneous concentration of dopant; and
  a gate electrode on the substrate and surrounding each of the plurality of horizontal doped semiconductor material layers.

14. The device of claim 13, wherein the source region is adjacent a first end of the superlattice structure and the drain region is adjacent a second opposing end of the superlattice structure.

15. The device of claim 13, wherein the homogeneous concentration of dopant is in a range of from about $10^{17}$ atoms/cm$^3$ to about $10^{21}$ atoms/cm$^3$ throughout the thickness of the plurality of horizontal doped semiconductor material layers.

16. The device of claim 13, wherein the dopant comprises about $10^{19}$ atoms/cm$^3$ of boron.

17. The device of claim 13, wherein the device has a gate voltage greater than or equal to about 0.400 V.

18. The device of claim 17, wherein the gate voltage required to turn on the device is greater than or equal to about 140% of the gate voltage required to turn on a device without the dopant.

19. The device of claim 17, wherein the gate voltage required to turn on the device is in the range of 1 to 2 times the gate voltage to turn on a device without the dopant.

20. The device of claim 13, wherein the conductive layer has a uniform thickness around each of the plurality of horizontal doped semiconductor material layers.

* * * * *